United States Patent
Yen et al.

(10) Patent No.: US 11,282,777 B2
(45) Date of Patent: Mar. 22, 2022

(54) SEMICONDUCTOR PACKAGE AND METHOD OF MANUFACTURING THE SAME

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 62 days.

(21) Appl. No.: 16/732,149

(22) Filed: Dec. 31, 2019

(65) Prior Publication Data
US 2021/0202362 A1 Jul. 1, 2021

(51) Int. Cl.
H01L 23/495 (2006.01)
H01L 23/498 (2006.01)
H01L 21/48 (2006.01)
H01L 23/00 (2006.01)

(52) U.S. Cl.
CPC ...... H01L 23/49827 (2013.01); H01L 21/486 (2013.01); H01L 24/08 (2013.01); H01L 24/80 (2013.01); *H01L 2224/08235* (2013.01); *H01L 2224/80895* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,596,768 | B2* | 3/2017 | We | H05K 1/111 |
| 2003/0136577 | A1* | 7/2003 | Abe | H01L 23/145 |
| | | | | 174/255 |
| 2003/0168256 | A1* | 9/2003 | Chien | H01L 24/82 |
| | | | | 174/264 |
| 2007/0126112 | A1* | 6/2007 | Cho | H05K 1/056 |
| | | | | 257/700 |
| 2009/0278238 | A1* | 11/2009 | Bonifield | H01L 21/76898 |
| | | | | 257/621 |
| 2011/0175215 | A1* | 7/2011 | Farooq | H01L 23/481 |
| | | | | 257/686 |
| 2012/0187545 | A1* | 7/2012 | Khan | H01L 23/49827 |
| | | | | 257/621 |
| 2013/0285256 | A1* | 10/2013 | Fischer | H01L 21/76898 |
| | | | | 257/774 |
| 2019/0229078 | A1* | 7/2019 | Kim | H01L 23/49827 |

* cited by examiner

*Primary Examiner* — Niki H Nguyen
(74) *Attorney, Agent, or Firm* — Foley & Lardner LLP

(57) ABSTRACT

A semiconductor package includes a core layer, a conductive interconnect and a semiconductor chip. The core layer has a top surface and a bottom surface opposite to the top surface. The conductive interconnect penetrates through the core layer. The conductive interconnect has a top surface and a bottom surface respectively exposed from the top surface and the bottom surface of the core layer. The semiconductor chip is disposed on the top surface of the core layer. The semiconductor chip includes a conductive pad, and the top surface of the conductive interconnect directly contacts the conductive pad.

23 Claims, 14 Drawing Sheets

SEMICONDUCTOR PACKAGE AND METHOD OF MANUFACTURING THE SAME

BACKGROUND

1. Technical Field

The present disclosure relates generally to a semiconductor package and a method of manufacturing the same. More particularly, the present disclosure relates to a semiconductor package including a conductive interconnect and a method of manufacturing the same.

2. Description of the Related Art

Semiconductor devices (e.g., dies) may be attached to a carrier (e.g. a substrate, a lead frame, etc.) and molded by an encapsulant or under-fill to form a package structure of an electronic device. With the advancements in miniaturization of package structures of electronic devices, gaps between dies have become narrower and solder bumps on the substrate have become smaller. As a result, there have been problems with molded under-fill being unable to completely fill the gaps between dies, which presents a challenge to efforts at improving the properties of package structures of electronic devices.

SUMMARY

In one or more embodiments, a semiconductor package includes a core layer, a conductive interconnect and a semiconductor chip. The core layer has a top surface and a bottom surface opposite to the top surface. The conductive interconnect penetrates through the core layer. The conductive interconnect has a top surface and a bottom surface respectively exposed from the top surface and the bottom surface of the core layer. The semiconductor chip is disposed on the top surface of the core layer. The semiconductor chip includes a conductive pad, and the top surface of the conductive interconnect directly contacts the conductive pad.

In one or more embodiments, a semiconductor package includes a core layer, a semiconductor chip, a conductive interconnect and an adhesive layer. The semiconductor chip is disposed on a top surface of the core layer. The semiconductor chip includes a conductive pad. The conductive interconnect penetrates through the core layer to electrically connect to the conductive pad. The adhesive layer is disposed between the core layer and the semiconductor chip. The adhesive layer directly contacts the semiconductor chip and the top surface of the core layer.

In one or more embodiments, a method for manufacturing a semiconductor device package includes: providing a core layer having at least one through hole; disposing a semiconductor chip on the core layer, wherein the semiconductor chip includes a conductive pad disposed above the at least one through hole; and disposing a conductive material layer in the at least one through hole to form a conductive interconnect directly contacting the conductive pad.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
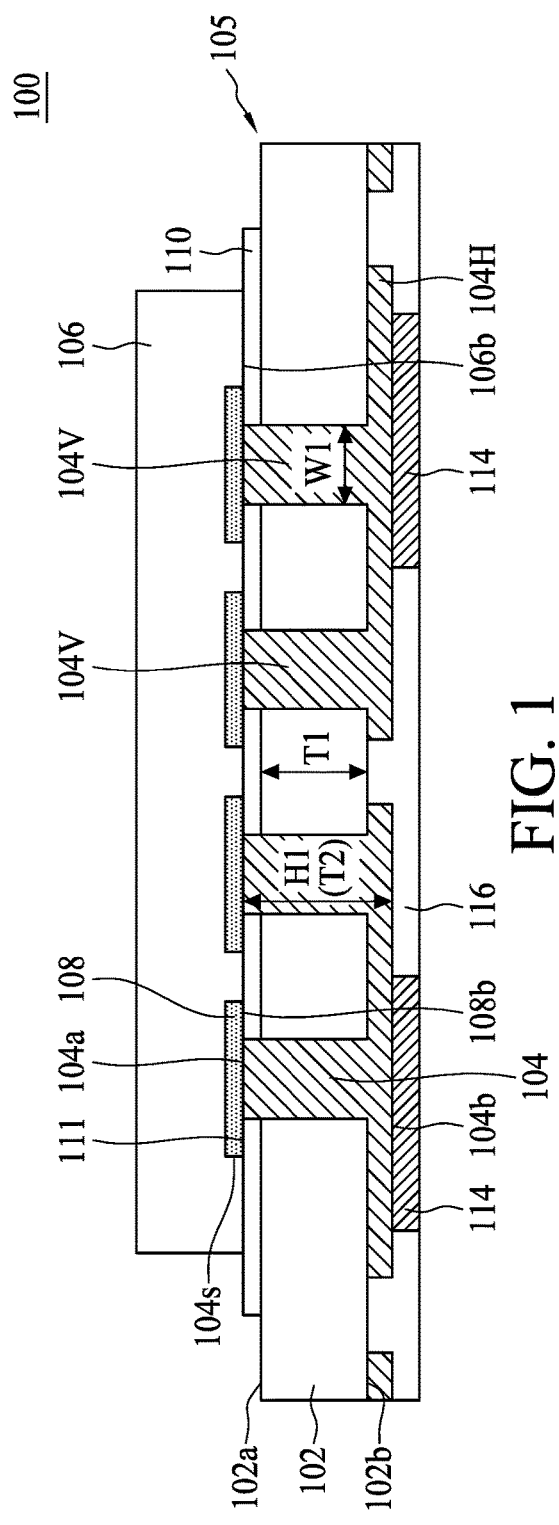
FIG. 1 illustrates a cross-sectional view of a semiconductor package in accordance with some embodiments of the present disclosure.

FIG. 1 illustrates a cross-sectional view of a semiconductor package 100 in accordance with some embodiments of the present disclosure. The semiconductor package 100 includes a core layer 102, a conductive interconnect 104, a semiconductor chip 106 and an insulation layer 110.

The core layer 102 has a surface 102a (also referred to as "a top surface") and a surface 102b (also referred to as "a bottom surface") opposite to the surface 102a. In some embodiments, the core layer 102 is formed of or includes a dielectric material, for example, quartz glass, e-glass, organic SBT, bismaleimide triazine (BT), FR4, FR5, polyimide (PI), polybenzoxazole, benzocyclobutene, or a combination of two or more thereof. In some embodiments, a thickness T1 of the core layer 102 is in a range from about 40 micrometers (μm) to about 100 μm.

The conductive interconnect 104 penetrates through the core layer 102. The conductive interconnect 104 has a surface 104a (also referred to as "a top surface") and a surface 104b (also referred to as "a bottom surface") opposite to the surface 104b. The surface 104a and the surface 104b of the conductive interconnect 104 are respectively exposed from the surface 102a and the surface 102b of the core layer 102. In some embodiments, the surface 102a of the core layer 102 and the surface 104a of the conductive interconnect 104 are at different elevations. In some embodiments, the conductive interconnect 104 is formed of or includes gold (Au), silver (Ag), copper (Cu), platinum (Pt), Palladium (Pd), other metal(s) or alloy(s), or a combination of two or more thereof. In some embodiments, a width W1 of the conductive interconnect 104 is in a range from about 10 μm to about 30 μm, for example, about 20 μm. In some embodiments, a thickness T2 of the conductive interconnect 104 is in a range from about 40 μm to about 110 μm. In some embodiments, the surface 102a of the core layer 102 is below the surface 104a of the conductive interconnect 104. In some embodiments, the core layer 102 and the conductive interconnect 104 collectively form an interconnection structure.

In some embodiments, the conductive interconnect 104 includes a vertical portion 104V penetrating through the core layer 102 and a horizontal portion 104H extending on at least a portion of the surface 102b of the core layer 102. In some embodiments, the conductive interconnect 104 includes a plurality of vertical portions 104V penetrating through the core layer 102. In some embodiments, the vertical portions 104V of the conductive interconnect 104 are connected to the horizontal portion 104H of the conductive interconnect 104. In some embodiments, the one or more vertical portions 104V are surrounded by the core layer 102. In some embodiments, the horizontal portion 104H directly contacts the bottom surface 102b of the core layer 102. In some embodiments, a height H1 (e.g., the thickness of the conductive interconnect 104) of each of the vertical portions 104V of the conductive interconnect 104 is greater than the thickness T1 of the core layer 102. In some embodiments, the vertical portion 104V can be referred to as a conductive via/pillar, and the horizontal portion 104H can be referred to as a conductive pad.

The semiconductor chip 106 is disposed on the surface 102a of the core layer 102. The semiconductor chip 106 includes a conductive pad 108, and the surface 104a of the conductive interconnect 104 directly contacts the conductive pad 108. The conductive interconnect 104 penetrates through the core layer 102 to electrically connect the conductive pad 108 of the semiconductor chip 106. In some embodiments, the conductive interconnect 104 directly contacts a surface 108b (also referred to as "a bottom surface") of the conductive pad 108. In some embodiments, a thickness of the conductive pad 108 is in a range from about 0.2 μm to about 0.3 μm. In some embodiments, the semiconductor chip 106 includes a silicon-based substrate.

In the cases where semiconductor chips are connected to a substrate (e.g., a printed circuit board; PCB) through solder bumps, as the gaps between the semiconductor chips and the solder bumps are relatively narrow and the solder bumps are relatively small due to the size reduction of devices, these gaps may be incompletely filled with a filling material (e.g., an under-fill layer or a molding compound) due to low flowability of the filling material in the narrow gaps. As a result, despite the costliness of the filling material, voids may be formed within the filling material in the gaps, which may adversely affect the electronic properties of the package structure. In addition, solder bumps may suffer from issues of cracking or formation of intermetallic compounds (IMC) under high-temperature processes. These issues may lead to the reduction of joint capability and adhesion strength of the solder bumps, which may adversely affect the reliability of the package structure. In accordance with some embodiments of the present disclosure, the conductive interconnect 104 penetrates through the core layer 102 to directly contact the conductive pad 108 for electrically connecting the semiconductor chip 106 to a substrate. As such, solder bump(s), under-fill layer(s) or molding compound(s) are no longer needed, and thus the aforementioned issues raised by the solder bump(s), under-fill layer(s) or molding compound(s) may be prevented. Specifically, the high-temperature reflowing process (e.g., at a temperature of at least about 250° C. or higher) of solder bumps is not required, and thus possible damage caused by high-temperature processes to the structure of the semiconductor package 100 may be effectively prevented. Moreover, since under-fill layer(s) or molding compound(s) is not required, the manufacturing cost is reduced, formation of voids within the structure of the semiconductor package 100 can be avoided, and the electronic performance of the semiconductor package 100 can be improved.

In some embodiments, the core layer 102 and the conductive interconnect 104 collectively form an interconnection structure 105. In some embodiments, the interconnection structure 105 is free from solder bumps. In some embodiments, the interconnection structure 105 is free from an under-fill layer or a molding compound. In some embodiments, the interconnection structure 105 may be referred to as Fan-Out Core Under Silicon (FOCUS) structure.

In some embodiments, the semiconductor package 100 is free from solder bumps between the semiconductor chip 106 and the core layer 102. In some embodiments, the semiconductor package 100 is free from solder bumps between the conductive pad 108 of the semiconductor chip 106 and the core layer 102. In some embodiments, the semiconductor package 100 is free from solder bumps between the surface 108b of the conductive pad 108 and the surface 102a of the core layer 102.

In some embodiments, the semiconductor package 100 is free from an under-fill layer or a molding compound between the semiconductor chip 106 and the core layer 102. In some embodiments, the semiconductor package 100 is free from an under-fill layer or a molding compound between the conductive pad 108 of the semiconductor chip 106 and the core layer 102. In some embodiments, the semiconductor package 100 is free from an under-fill layer or a molding compound between the surface 108b of the conductive pad 108 and the surface 102a of the core layer 102.

The insulation layer 110 is disposed between and directly contacting the surface 102a of the core layer 102 and a surface 106b (also referred to as "a bottom surface") of the semiconductor chip 106. In some embodiments, at least a portion 111 of the insulation layer 110 directly contacts the surface 102a of the core layer 102, the surface 108b of the conductive pad 108 and the conductive interconnect 104. In some embodiments, the insulation layer 110, also referred to as an adhesive layer 110, is disposed between the core layer 102 and the semiconductor chip 106. In some embodiments, the adhesive layer 110 directly contacts the conductive pad 108 and the conductive interconnect 104. In some embodiments, the adhesive layer 110 directly contacts the surface 108b of the conductive pad 108 and a portion of a surface 104s (also referred to as "a lateral surface") of the conductive interconnect 104. In some embodiments, the portion 111 of the adhesive layer 110 is surrounded by and directly contacts the conductive pad 108, the conductive interconnect 104 and the core layer 102. In some embodiments, a thickness of the adhesive layer 110 is in a range from about 5 µm to about 10 µm.

The semiconductor package 100 further includes a metal finish layer 114 in accordance with some embodiments of the present disclosure. In some embodiments, the metal finish layer 114 is disposed on the surface 104b of the conductive interconnect 104. In some embodiments, the metal finish layer 114 is different in material from the conductive interconnect 104. In some embodiments, the metal finish layer 114 is formed of or includes Ni, Au or alloy(s). In some embodiments, a solder bump may be formed on the metal finish layer 114 to connect the semiconductor chip 106 to a package substrate (e.g., a PCB).

The semiconductor package 100 further includes a dielectric layer 116 in accordance with some embodiments of the present disclosure. In some embodiments, the dielectric layer 116 is disposed on the surface 102a of the core layer 102 and the surface 104b of the conductive interconnect 104. In some embodiments, the dielectric layer 116 is disposed adjacent to the metal finish layer 114. In some embodiments, the dielectric layer 116 directly contacts the metal finish layer 114. In some embodiments, the dielectric layer 116 directly contacts the surface 102b of the core layer 102. In some embodiments, the dielectric layer 116 directly contacts the surface 104b of the conductive interconnect 104. In some embodiments, the dielectric layer 116 is formed of or includes a solder resist.

Figure 2:
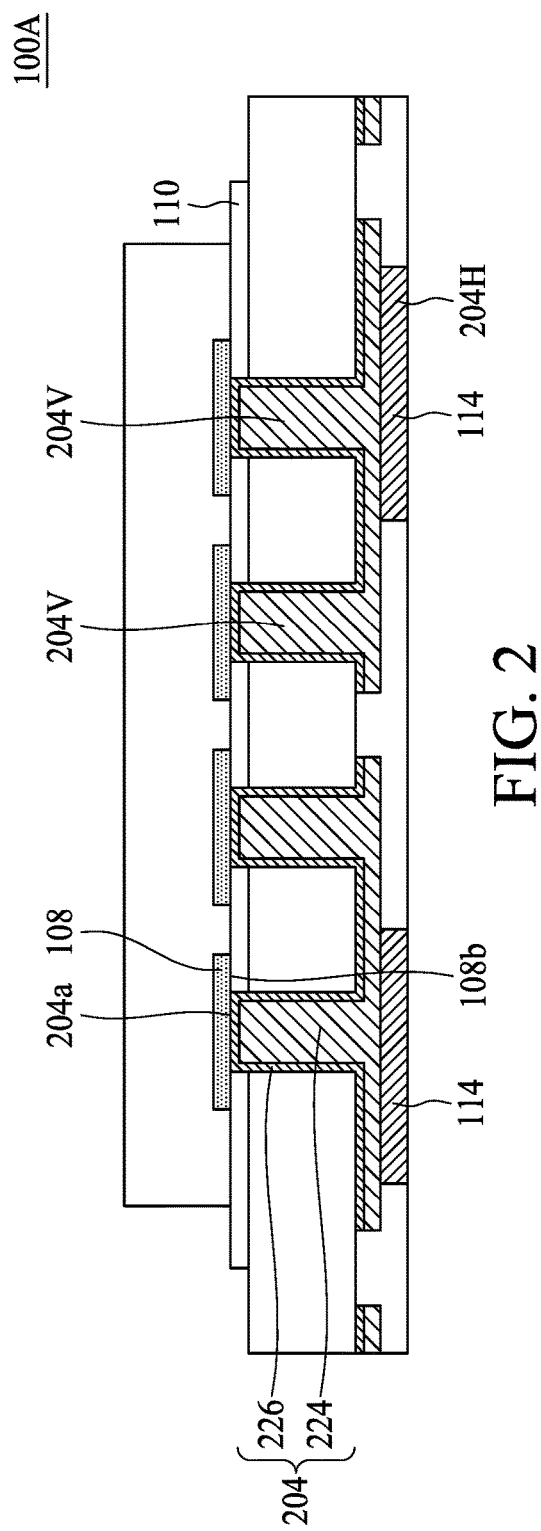
FIG. 2 illustrates a cross-sectional view of a semiconductor package in accordance with some embodiments of the present disclosure.

FIG. 2 illustrates a cross-sectional view of a semiconductor package 100A in accordance with some embodiments of the present disclosure. The semiconductor package 100A is similar to the semiconductor package 100 in FIG. 1 except that, for example, the conductive interconnect 204 includes a conductive layer 224 and a seed layer 226. In some embodiments, the conductive layer 224 penetrates through the core layer 102, and the seed layer 226 is disposed between and directly contacts the conductive layer 224 and the conductive pad 108. In some embodiments, a surface 204a (also referred to as "a top surface") (e.g. a surface of the seed layer 226) of the conductive interconnect 204 is in direct contact with the surface 108b of the conductive pad 108.

In some embodiments, the conductive layer 224 and the seed layer 226 collectively form a vertical portion 204V penetrating through the core layer 102 and a horizontal portion 204H extending on at least a portion of the surface 102b of the core layer 102. In some embodiments, the seed layer 226 of the vertical portion 204V surrounds the conductive layer 224 of the vertical portion 204V. In some embodiments, the seed layer 226 directly contacts the insulation layer 110 (also referred to as the adhesive layer 110). In some embodiments, the insulation layer 110 is spaced apart from the conductive layer 224 by the seed layer 226. In some embodiments, a thickness of the seed layer 226 is in a range from about 0.1 µm to about 0.3 µm.

Figure 3:
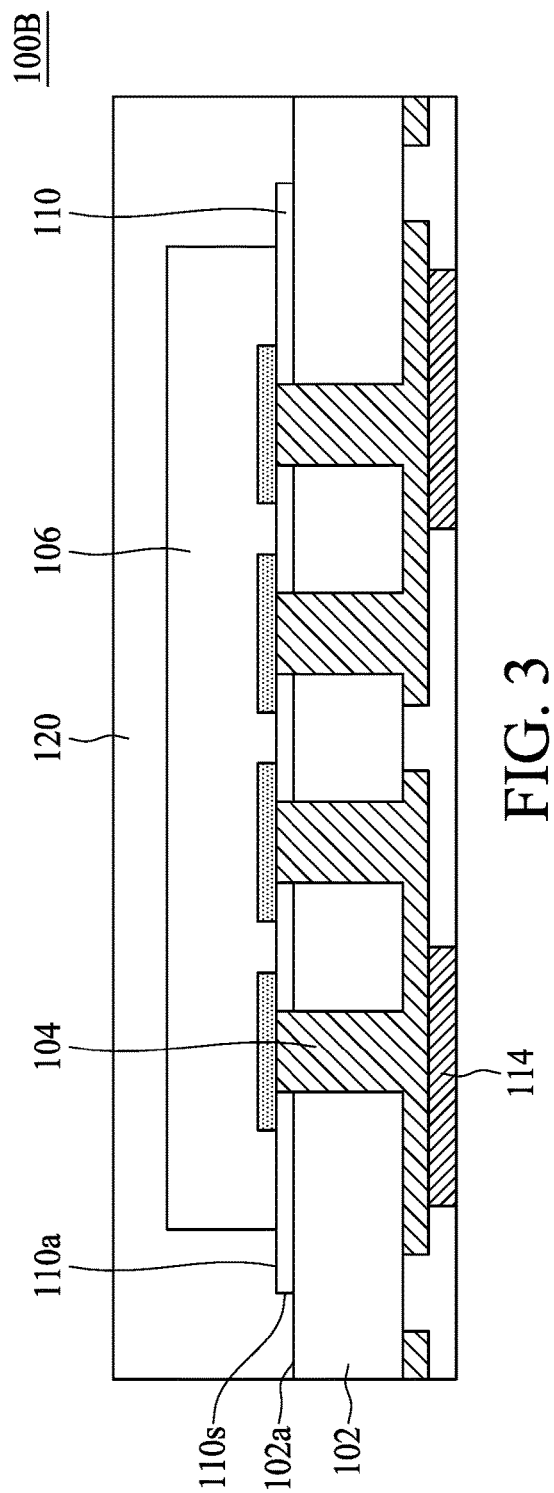
FIG. 3 illustrates a cross-sectional view of a semiconductor package in accordance with some embodiments of the present disclosure.

FIG. 3 illustrates a cross-sectional view of a semiconductor package 100B in accordance with some embodiments of the present disclosure. The semiconductor package 100B is similar to the semiconductor package 100 in FIG. 1 except that, for example, the semiconductor package 100B further includes an encapsulation layer 120. In some embodiments, the encapsulation layer 120 is disposed on the semiconductor chip 106 and directly contacts the surface 102a of the core layer 102.

In some embodiments, the encapsulation layer 120 directly contacts the insulation layer 110 (also referred to as the adhesive layer 110). In some embodiments, the insulation layer 110 has a surface 110a (also referred to as "a top surface") and a surface 110s (also referred to as "a lateral surface") substantially perpendicular to the surface 110a. In addition, the encapsulation layer 120 directly contacts the surface 110a and the surface 110s of the insulation layer 110. In some embodiments, the encapsulation layer 120 is spaced apart from the metal finish layer 114 (also referred to as "RDL") and the dielectric layer 116 by the core layer 102 and the conductive interconnect 104. In the cases where semiconductor chips are connected to a substrate (e.g., PCB) through RDLs and a dielectric layer, the RDLs and the dielectric layer are directly adhered to the semiconductor chips and the encapsulant surrounding the semiconductor chips. The adhesion strength of the metal finish layer 114 and the dielectric layer 116 onto the core layer 102 is higher than the adhesion strength of the metal finish layer 114 and the dielectric layer 116 onto the encapsulation layer 120. Thus, the structural strength of the semiconductor package 100B is improved, and the reliability of the semiconductor package 100B is increased as well.

Figure 4:
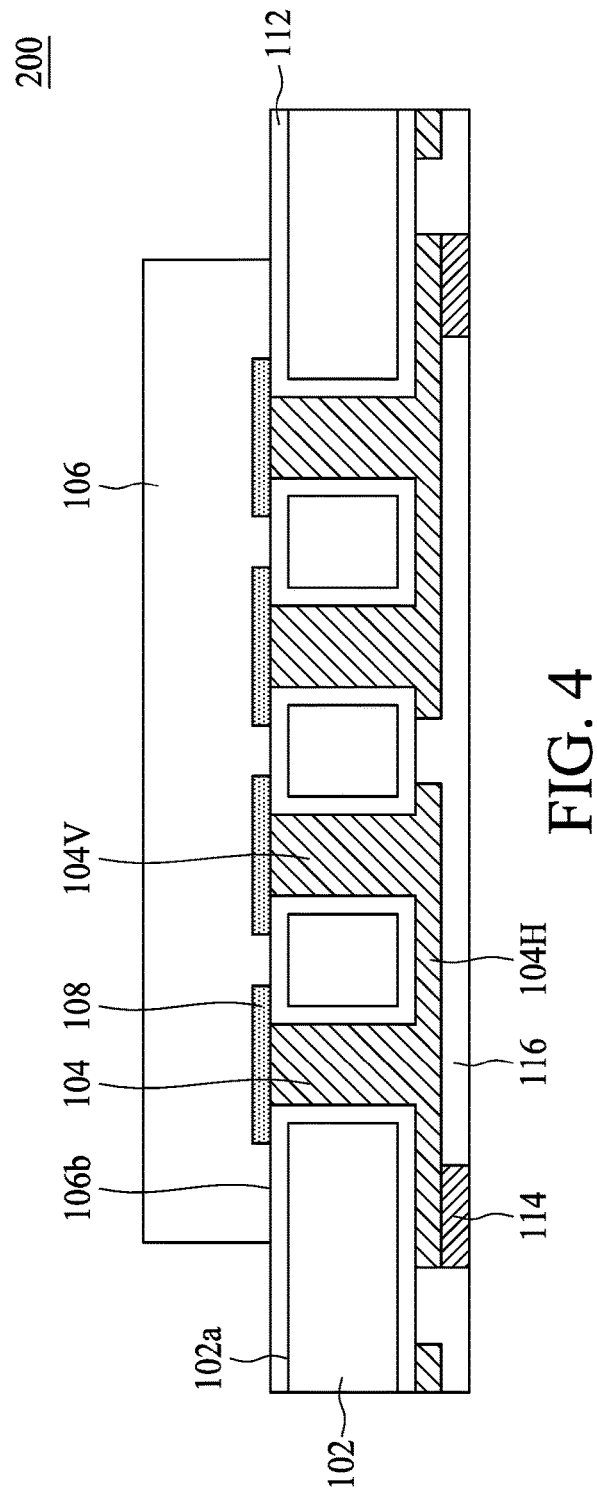
FIG. 4 illustrates a cross-sectional view of a semiconductor package in accordance with some embodiments of the present disclosure.

FIG. 4 illustrates a cross-sectional view of a semiconductor package 200 in accordance with some embodiments of the present disclosure. The semiconductor package 200 is similar to the semiconductor package 100 in FIG. 1 except that, for example, the semiconductor package 200 includes an insulation layer 112, and the core layer 102 is spaced apart from the conductive interconnect 104 by the insulation layer 112. In some embodiments, the insulation layer 112 is disposed on the core layer 102. In some embodiments, the insulation layer 112 is disposed between and directly contacts the surface 102a of the core layer 102 and the surface 106b of the semiconductor chip 106.

In some embodiments, the core layer 102 is formed of or includes a dielectric material (e.g., quartz glass, e-glass, organic SBT, bismaleimide triazine (BT), FR4, FR5, polyimide (PI), polybenzoxazole, benzocyclobutene, or a combination of two or more thereof), a semiconductor material (e.g., silicon) and/or a metal material (e.g., copper, invar, molybdenum, tungsten, titanium, tantalum, ruthenium, nickel, other metal(s) or alloy(s), or a combination of two or more thereof). The core layer 102 being formed of or including a metal material is advantageous for the increased heat dissipation capacity.

In some embodiments, the core layer 102 is formed of or includes a metal material having a coefficient of thermal expansion (CTE) from about $2 \times 10^{-6}$ per kevin ($2 \times 10^{-6}$/K) to about $10 \times 10^{-6}$/K. In some embodiments, the core layer 102 is formed of or includes a metal material having a CTE from about $2 \times 10^{-6}$/K to about $8 \times 10^{-6}$/K. In some embodiments, the core layer 102 is formed of or includes a Cu/invar/Cu multilayered structure or molybdenum alloy. In some embodiments, the semiconductor chip 106 includes a semiconductor substrate, and a difference between a CTE of the semiconductor substrate of the semiconductor chip 106 and the CTE of the metal material of the core layer 102 is smaller than $10 \times 10^{-6}$/K. In some embodiments, a difference between the CTE of the semiconductor substrate of the semiconductor chip 106 and the CTE of the metal material of the core layer 102 is smaller than $6 \times 10^{-6}$/K. In some embodiments, a difference between a CTE of the semiconductor substrate of the semiconductor chip 106 and the CTE of the metal material of the core layer 102 is smaller than $4 \times 10^{-6}$/K. In some embodiments, the semiconductor substrate of the semiconductor chip 106 is a silicon-based substrate. With the design of the CTE of the core layer 102 being close to that of the semiconductor chip 106, warpage of layers in the semiconductor package 200 due to mismatch of CTEs can be reduced, and thus the reliability of the semiconductor package 200 can be improved.

In some embodiments, the core layer 102 is isolated from the conductive interconnect 104 by the insulation layer 112. In some embodiments, the insulation layer 112 surrounds the vertical portion 104V of the conductive interconnect 104. In some embodiments, the insulation layer 112 directly contacts the horizontal portion 104H of the conductive interconnect 104. In some embodiments, the insulation layer 112 directly contacts the dielectric layer 116. In some embodiments, the insulation layer 112 is formed of or includes polyimide (PI). With the design of the core layer 102 formed of or including a metal material and the insulation layer 112 formed of or including PI, the semiconductor package 200 can be provided with a relatively high temperature operation window.

Figure 5:
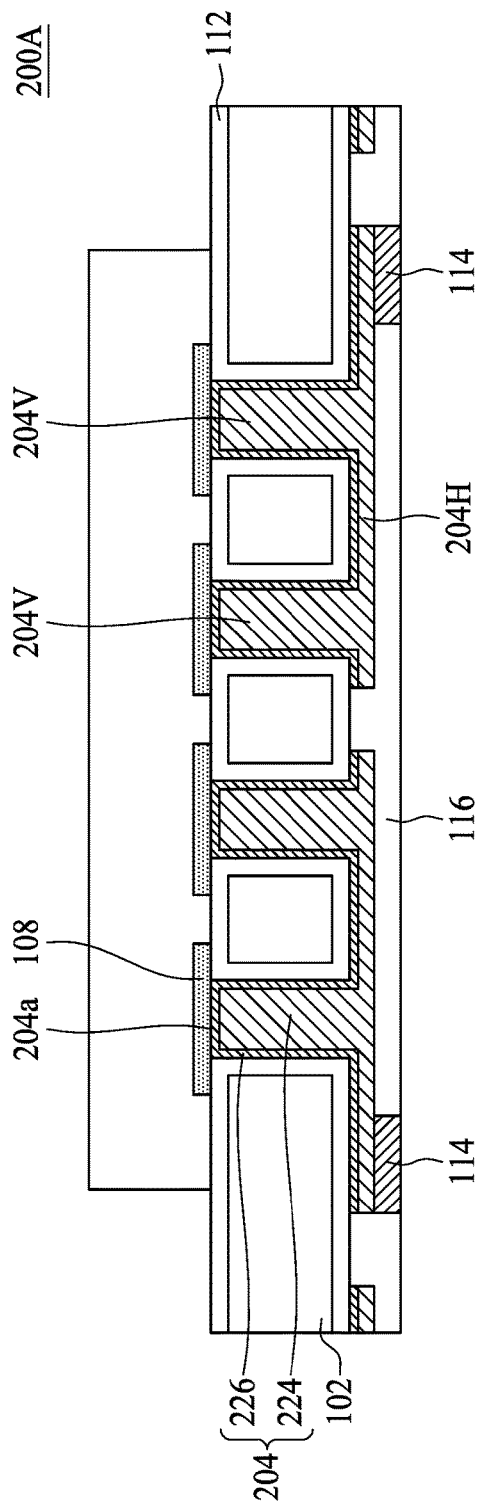
FIG. 5 illustrates a cross-sectional view of a semiconductor package in accordance with some embodiments of the present disclosure.

FIG. 5 illustrates a cross-sectional view of a semiconductor package 200A in accordance with some embodiments of the present disclosure. The semiconductor package 200A is similar to the semiconductor package 200 in FIG. 4 except that, for example, the conductive interconnect 204 includes a conductive layer 224 and a seed layer 226. In some embodiments, the conductive layer 224 penetrates through the core layer 102, and the seed layer 226 is disposed between and directly contacts the conductive layer 224 and the conductive pad 108. In some embodiments, the surface 204a (e.g. a surface of the seed layer 226) of the conductive interconnect 204 is in direct contact with the surface 108b of the conductive pad 108.

In some embodiments, the conductive layer 224 and the seed layer 226 collectively form a vertical portion 204V penetrating through the core layer 102 and a horizontal portion 204H extending on at least a portion of the surface 102b of the core layer 102. In some embodiments, the seed layer 226 is interposed between the core layer 102 and the horizontal portion 204H of the conductive interconnect 204. In some embodiments, the seed layer 226 directly contacts the insulation layer 112. In some embodiments, the insulation layer 112 is spaced apart from the conductive layer 224 by the seed layer 226.

Figure 6:
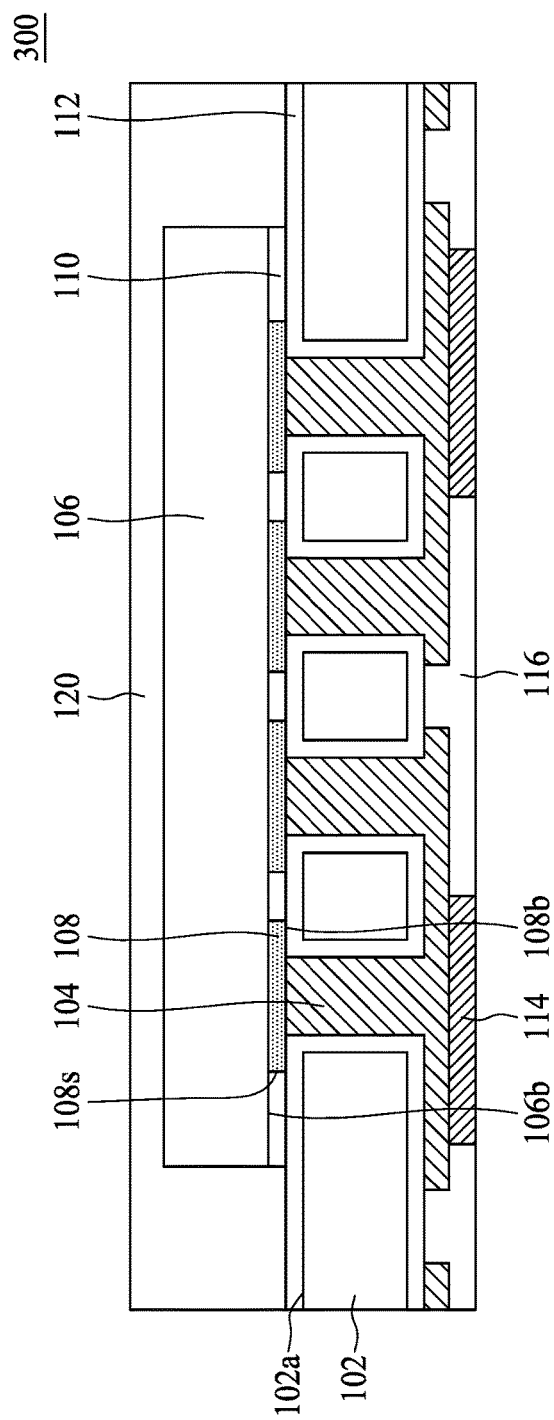
FIG. 6 illustrates a cross-sectional view of a semiconductor package in accordance with some embodiments of the present disclosure.

FIG. 6 illustrates a cross-sectional view of a semiconductor package 300 in accordance with some embodiments of the present disclosure. The semiconductor package 300 is similar to the semiconductor package 200 in FIG. 4 except that, for example, the semiconductor package 300 further includes an encapsulation layer 120 and an adhesive layer 110. In some embodiments, the adhesive layer 110 surrounds the conductive pad 108. In some embodiments, the encapsulation layer 120 is disposed on the semiconductor chip 106 and directly contacts the adhesive layer 110.

In some embodiments, the conductive pad 108 has a surface 108s (also referred to as "a lateral surface") substantially perpendicular to the surface 108b, and the adhesive layer 110 directly contacts the surface 108s of the conductive pad 108. In some embodiments, the adhesive layer 110 directly contacts the surface 106b of the semiconductor chip 106. In some embodiments, the adhesive layer 110 is disposed between and directly contacts the surface 106b of the semiconductor chip 106 and the insulation layer 112. In other words, the semiconductor chip 106 including the conductive pad 108 is adhered to the insulation layer 112 through the adhesive layer 110.

FIGS. 7A, 7B, 7C, 7D, 7E and 7F illustrate a method of manufacturing a semiconductor package in accordance with some embodiments of the present disclosure. Various figures have been simplified for better understanding of the aspects of the present disclosure.

Figure 7A:
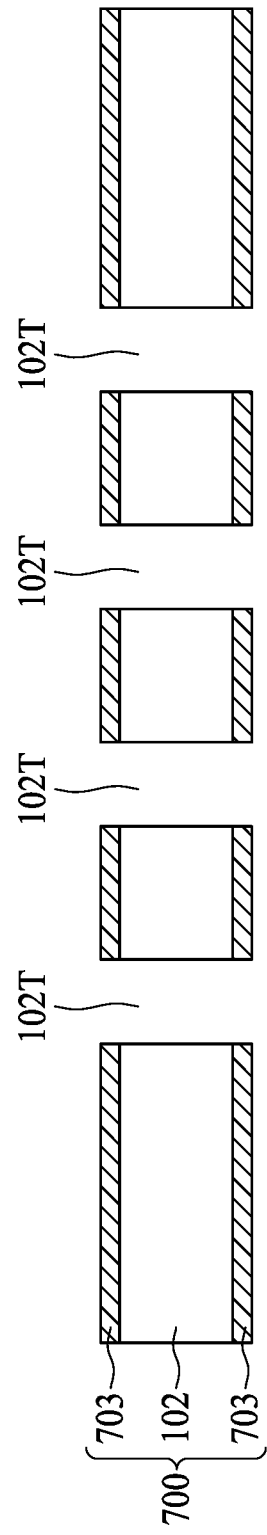
FIG. 7A, FIG. 7B, FIG. 7C, FIG. 7D, FIG. 7E and FIG. 7F illustrate a method of manufacturing a semiconductor package in accordance with some embodiments of the present disclosure.

Referring to FIG. 7A, a carrier 700 is provided. The carrier 700 includes an organic core layer 102 and is provided with metal layers 703 (e.g., copper foil) on two opposite surfaces thereof. Then at least one through hole 102T is formed by penetrating through the metal layers 703 and the organic core layer 102 by, for example, mechanical drilling or laser drilling.

Figure 7B:
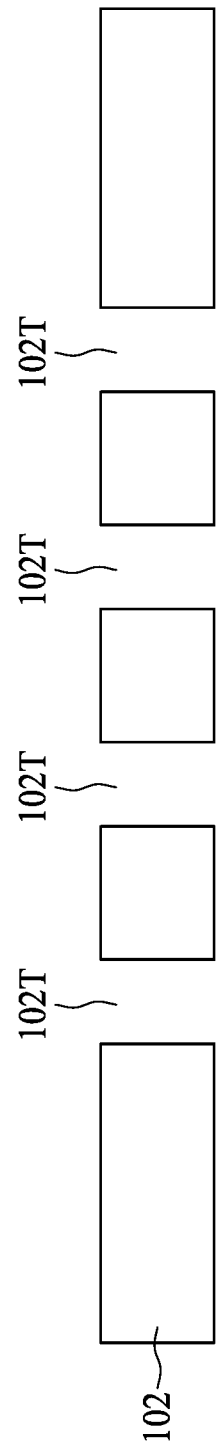

Referring to FIG. 7B, the metal layers 703 are removed. In some embodiments, the metal layers 703 are removed by an etching process.

Figure 7C:
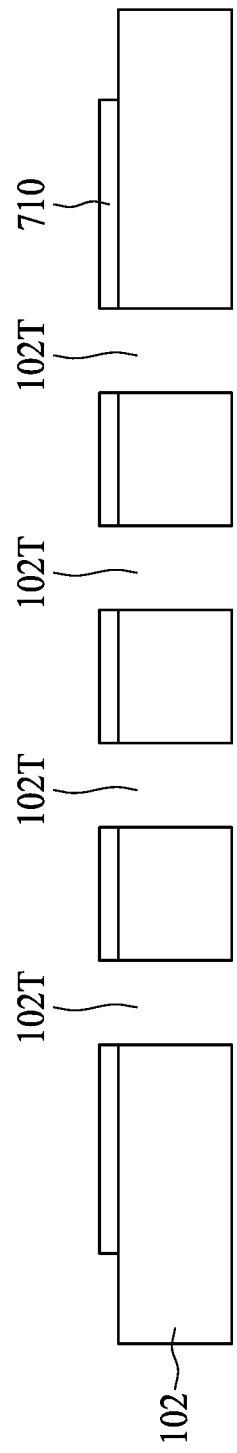

Referring to FIG. 7C, an adhesive material layer 710 is formed on a surface 102a of the core layer 102 by, for example, a coating process.

Figure 7D:
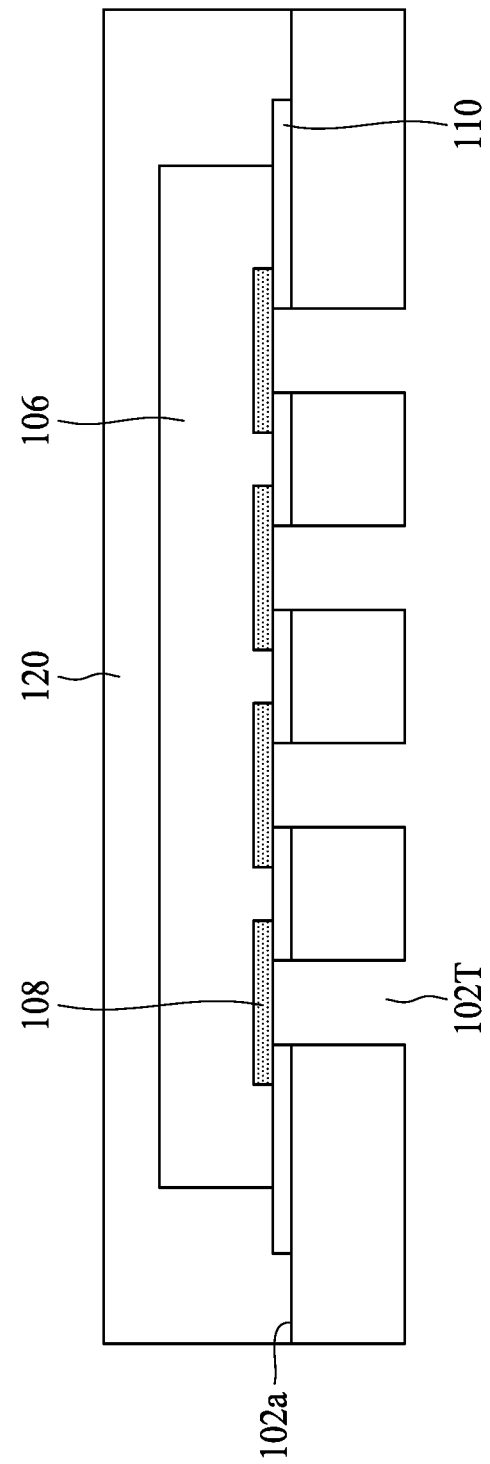

Referring to FIG. 7D, a semiconductor chip 106 including a conductive pad 108 is attached to the core layer 102. The conductive pad 108 is disposed above and corresponds in position to the at least one through hole 102T. The adhesive material layer 710 is then cured after attaching the semiconductor chip 106, resulting in an adhesive layer 110 on the surface 102a of the core layer 102. In some embodiments, the adhesive material layer 710 is cured at a temperature equal to or lower than 150 degrees Celsius (° C.). In some embodiments, the adhesive material layer 710 is cured at a temperature equal to or lower than 120° C. In some embodiments, the adhesive material layer 710 is cured at a temperature equal to or lower than 100° C. In some embodiments, the semiconductor chip 106 is disposed on and directly contacts the adhesive layer 110 to be attached to the core layer 102. Then, an encapsulation layer 120 is formed on the semiconductor chip 106. In some embodiments, the encapsulation layer 120 covers the semiconductor chip 106 and directly contacts the core layer 102.

Figure 7E:
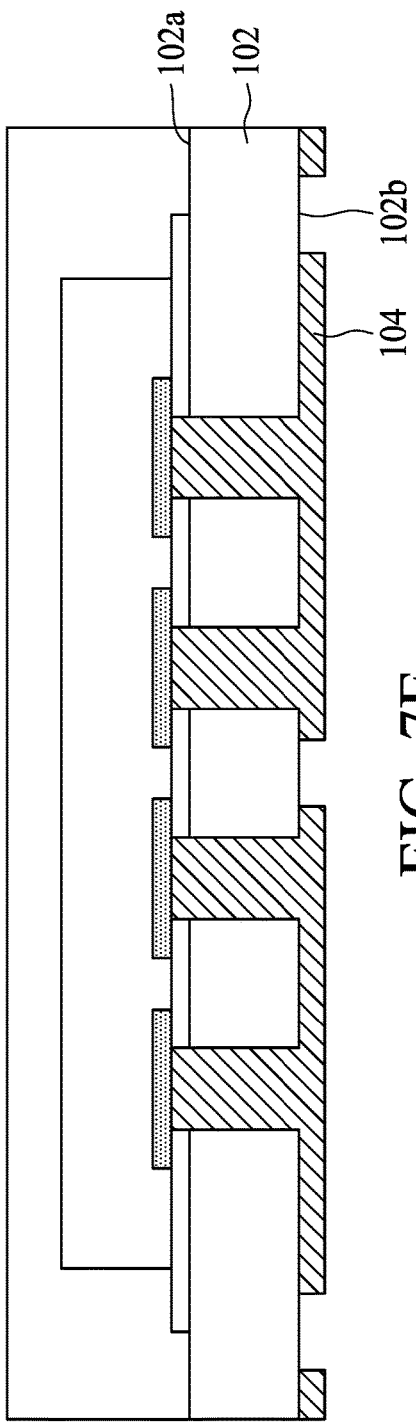

Referring to FIG. 7E, a conductive interconnect 104 is formed. The conductive interconnect 104 directly contacts the conductive pad 108 of the semiconductor chip 106. In some embodiments, portions of the surface 102a of the core layer 102 are exposed from the conductive interconnect 104. In some embodiments, the conductive interconnect 104 may be formed by the following operations: (i) disposing a conductive material layer in the at least one through hole 102T directly contacting the conductive pad 108 and covering a surface 102b of the core layer 102 by, for example, physical vapor deposition (PVD) or plating; and (ii) partially removing the conductive material layer by, for example, etching, to expose portions of the surface 102b of the core layer 102. In some other embodiments, the conductive interconnect 104 may be formed by the following operations: (i) forming a patterned photoresist on the surface 102a of the core layer 102 by, for example, forming a photoresist and performing exposing, developing and etching processes on the photoresist; and (ii) disposing a conductive material layer in the at least one through hole 102T directly contacting the conductive pad 108 by, for example, PVD or plating, wherein the conductive material layer covers the patterned photoresist and the portions of the surface 102a exposed from the patterned photoresist; and (iii) removing the patterned photoresist along with the portions of the conductive material layer directly on the patterned photoresist.

Figure 7F:
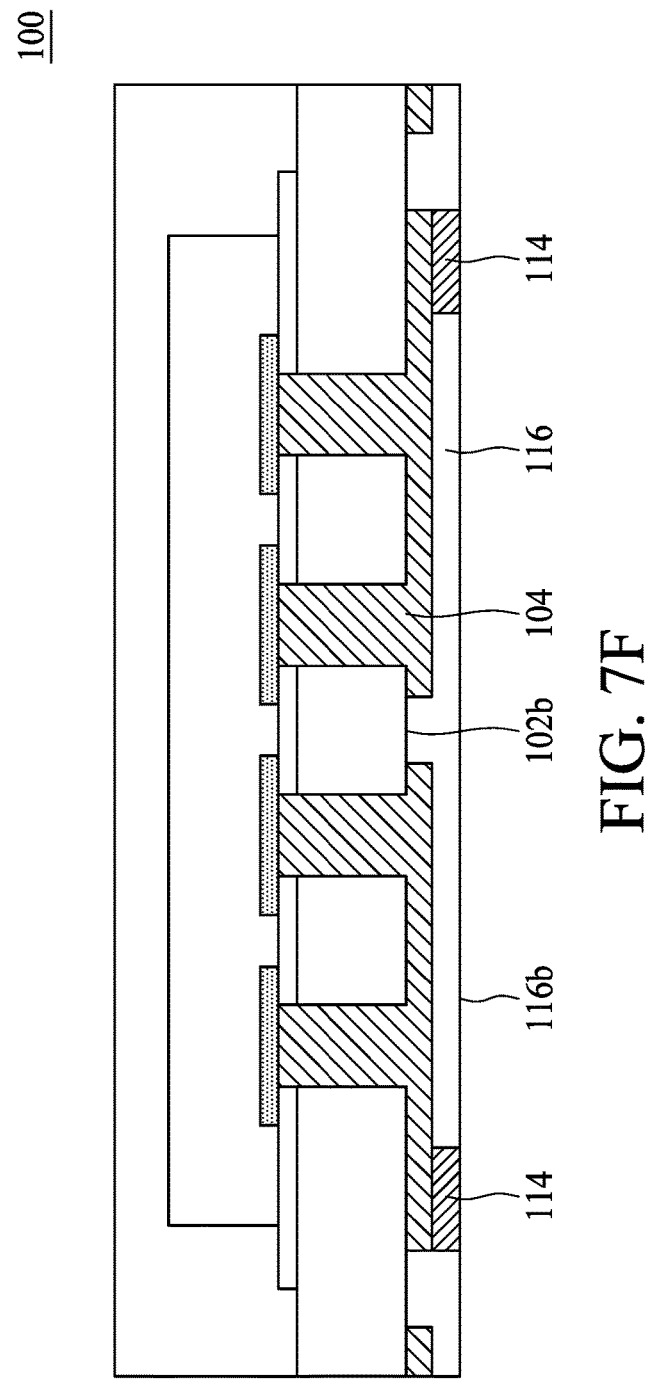

Referring to FIG. 7F, a dielectric layer 116 is formed on the conductive interconnect 104 and the surface 102a of the core layer 102 exposed from the conductive interconnect 104. A metal finish layer 114 is then formed on the conductive interconnect 104 and adjacent to the dielectric layer 116. In some embodiments, the dielectric layer 116 may be formed by the following operations: (i) forming a dielectric material layer on the conductive interconnect 104 and the surface 102a exposed from the conductive interconnect 104 by, for example, coating or printing; and (ii) performing exposing, developing and etching processes to pattern the dielectric material layer, exposing locations for the metal finish layer 114 from one or more openings within the dielectric material layer. In some embodiments, the metal finish layer 114 may be formed by the following operations: (i) forming a metal material layer in the one or more openings within the dielectric layer 116 by, for example, plating; and (ii) partially removing the metal material layer to expose a surface 116*b* (also referred to as "a bottom surface") of the dielectric layer 116 to form the metal finish layer 114 within the dielectric layer 116.

Figure 8:
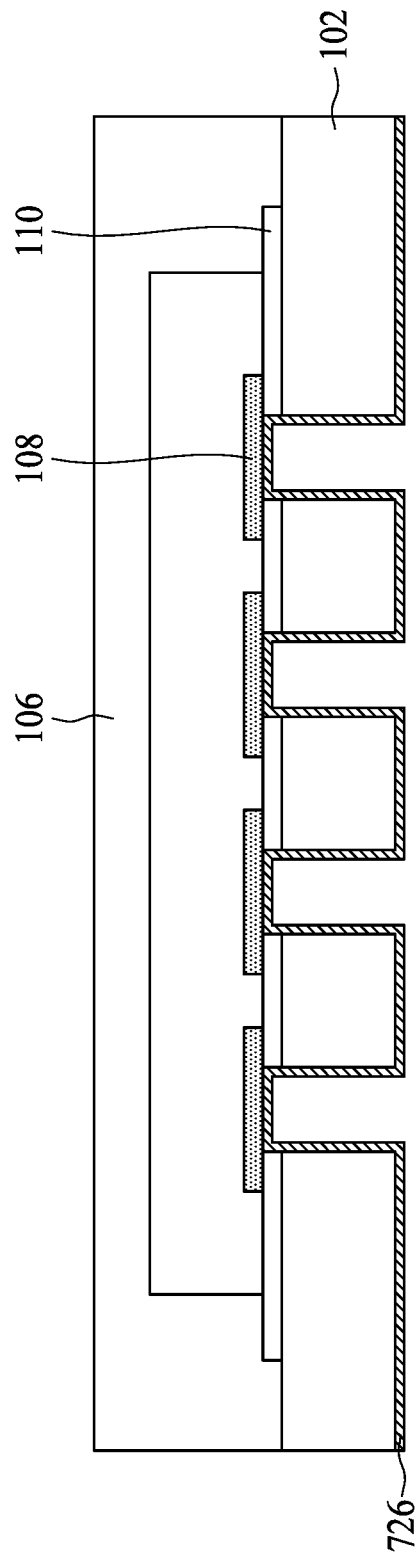
FIG. 8 illustrates an intermediate stage of a method of manufacturing a semiconductor package in accordance with some embodiments of the present disclosure.

FIG. 8 illustrates an intermediate stage of a method of manufacturing a semiconductor package in accordance with some embodiments of the present disclosure. It should be noted that FIGS. 7A, 7B, 7C, 7D, 7E and 7F are also referred to for illustrating the method of FIG. 8. The figure has been simplified for better understanding of the aspects of the present disclosure.

Referring to FIG. 8, after the operations as illustrated in FIGS. 7A, 7B, 7C and 7D are performed, a seed layer 726 is formed in the at least one through hole 102T. In some embodiments, the seed layer 726 may be formed by, for example, a plating process. In some embodiments, the seed layer 726 is conformal with the exposed surfaces of the core layer 102, the adhesive layer 110 and the conductive pad 108 of the semiconductor chip 106. In some embodiments, the seed layer 726 directly contacts the core layer 102, the adhesive layer 110 and the conductive pad 108 of the semiconductor chip 106.

Next, referring to FIGS. 7E and 2, a conductive material layer is formed on the seed layer 726, and then the conductive material layer and the seed layer 726 are partially removed to form a conductive layer 224 and a seed layer 226 as shown in FIG. 2. The conductive layer 224 and the seed layer 226 collectively form a conductive interconnect 204. After the conductive interconnect 204 is formed, an operation similar to that illustrated in FIG. 7F is then performed to form the semiconductor package 100A as shown in FIG. 2.

FIGS. 9A, 9B, 9C, 9D, 9E, 9F and 9G illustrate a method of manufacturing a semiconductor package in accordance with some embodiments of the present disclosure. Various figures have been simplified for better understanding of the aspects of the present disclosure.

Figure 9A:
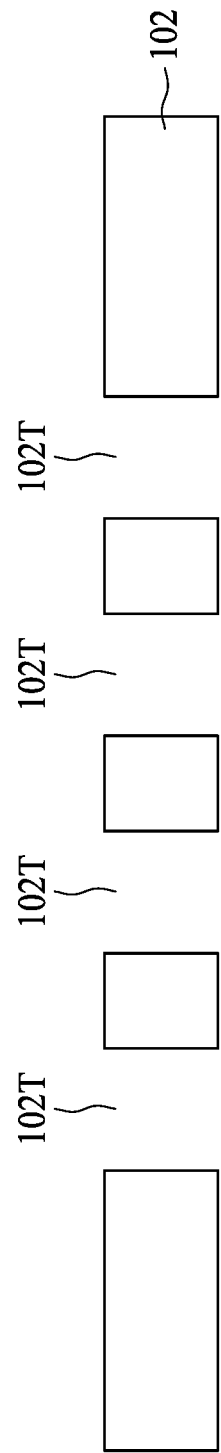
FIG. 9A, FIG. 9B, FIG. 9C, FIG. 9D, FIG. 9E, FIG. 9F and FIG. 9G illustrate a method of manufacturing a semiconductor package in accordance with some embodiments of the present disclosure.

Referring to FIG. 9A, a core layer 102 having at least one through hole 102T is provided. In some embodiments, the core layer 102 is formed of or includes a metal material having a CTE from about $2 \times 10^{-6}$/K to about $10 \times 10^{-6}$/K.

Figure 9B:
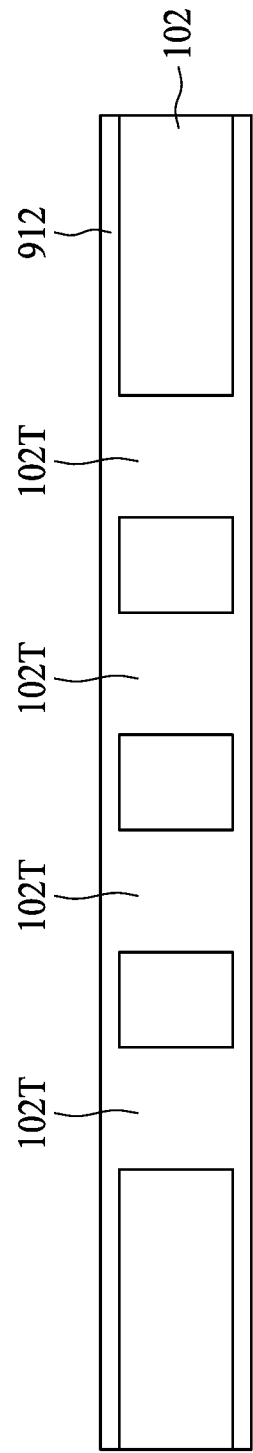

Referring to FIG. 9B, an insulation material layer 912 is formed to cover the core layer 102 and fill the at least one through hole 102T. In some embodiments, the insulation material layer 912 may be formed by the following operations: (i) coating an insulation material on the core layer 102 and filling the at least one through hole 102T with the insulation material; and (ii) curing the insulation material to form the insulation material layer 912. In some embodiments, the insulation material layer 912 is formed of or includes polyimide (PI). In some embodiments, the insulation material is cured at a temperature ranging from about 250° C. to about 300° C.

Figure 9C:
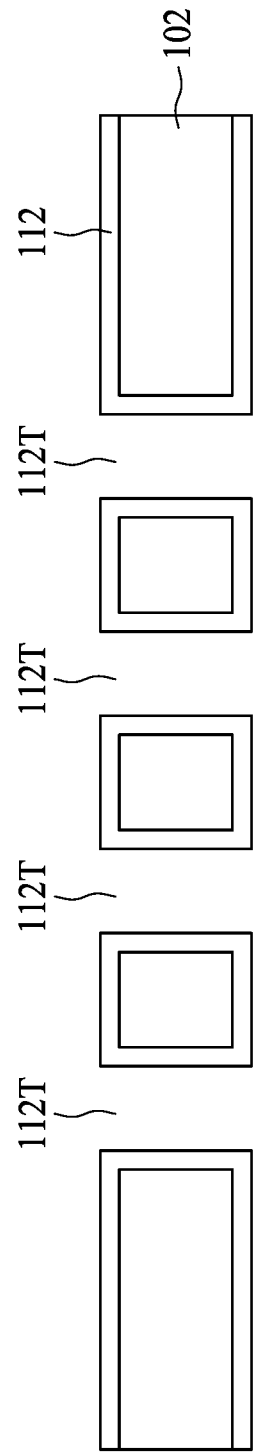

Referring to FIG. 9C, the insulation material layer 912 is partially removed to form at least one opening 112T within the at least one through hole 102T. In some embodiments, the insulation material layer 912 is partially removed by, for example, a laser drilling process, a mechanical drilling process, or a combination thereof. In some embodiments, the as-formed insulation layer 112 covers the core layer 102.

Figure 9D:
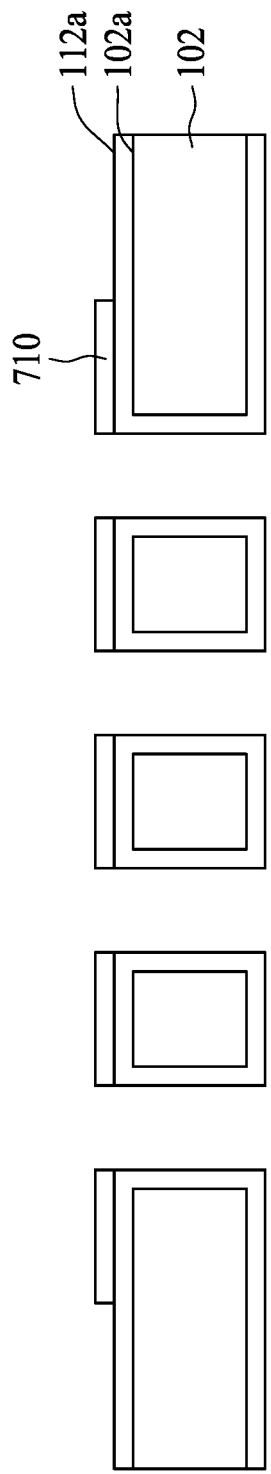

Referring to FIG. 9D, an adhesive material layer 710 is formed on a surface 102*a* of the core layer 102 by, for example, a coating process. In some embodiments, the adhesive layer 110 is coated on a surface 112*a* (also referred to as "a top surface") of the insulation layer 112.

Figure 9E:
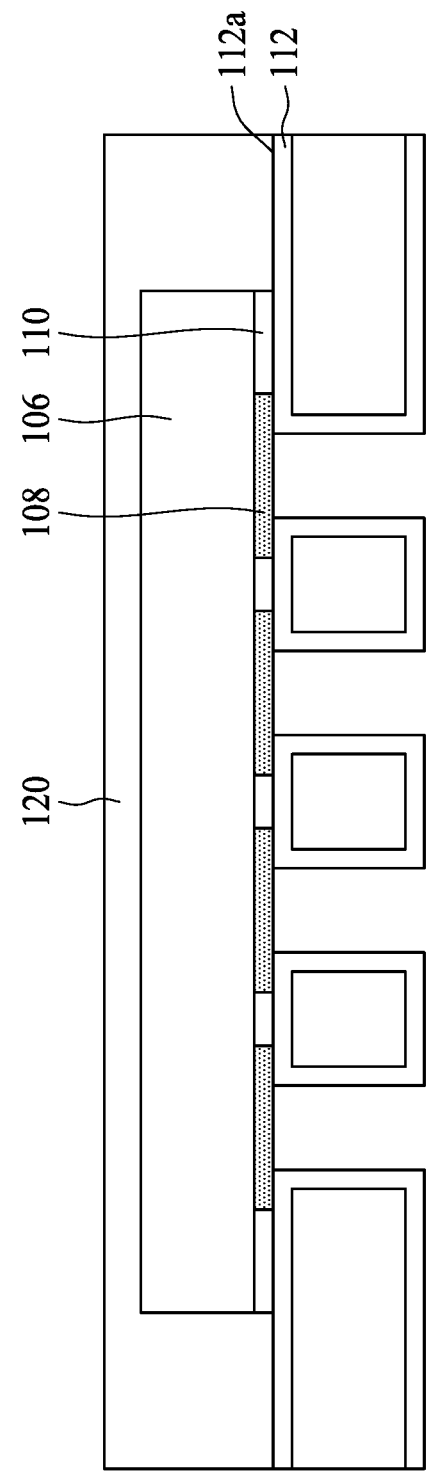

Referring to FIG. 9E, a semiconductor chip 106 including a conductive pad 108 is disposed on the core layer 102. The conductive pad 108 is disposed above and corresponds in position to the at least one through hole 102T. The adhesive material layer 710 has a relatively high flowability and is thus squeezed away by the conductive pad 108, so that the conductive pad 108 directly contacts the surface 112*a* of the insulation layer 112. The adhesive material layer 710 is then cured after the semiconductor chip 106 is disposed, resulting in an adhesive layer 110 on the surface 112*a* of the insulation layer 112 and surrounding the conductive pad 108. An encapsulation layer 120 is then formed on the semiconductor chip 106 and directly contacts the insulation layer 112.

Figure 9F:
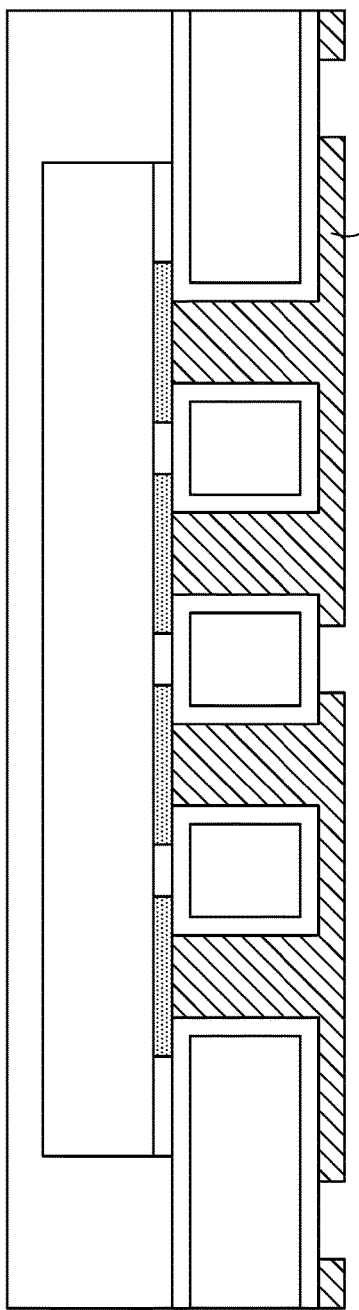
Figure 9G:
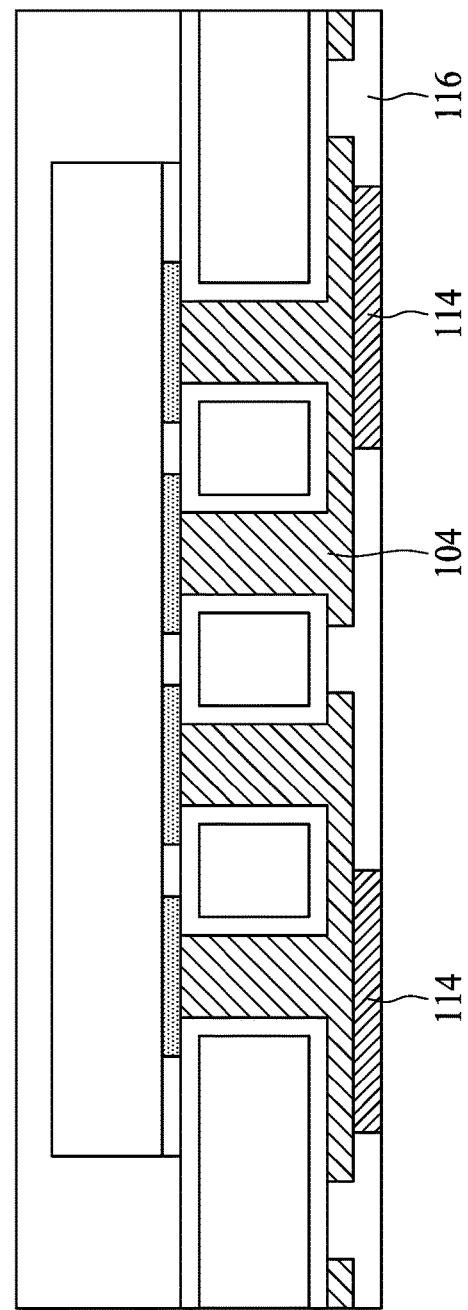

Referring to FIGS. 9F and 9G, operations similar to those illustrated in FIGS. 7E and 7F are then performed to form the semiconductor package 300 as shown in FIG. 6.

Figure 10:
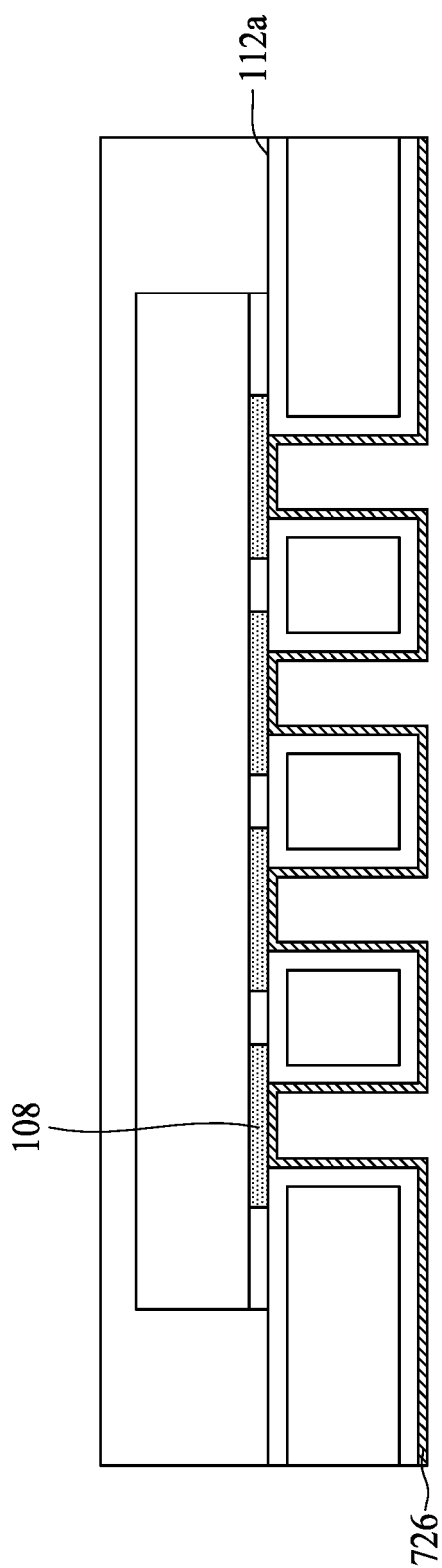
FIG. 10 illustrates an intermediate stage of a method of manufacturing a semiconductor package in accordance with some embodiments of the present disclosure.

FIG. 10 illustrates an intermediate stage of a method of manufacturing a semiconductor package in accordance with some embodiments of the present disclosure. It should be noted that FIGS. 9A, 9B, 9C, 9D, 9E, 9F and 9G are also referred to for illustrating the method of FIG. 10. The figure has been simplified for better understanding of the aspects of the present disclosure.

Referring to FIG. 10, after the operations as illustrated in FIGS. 9A, 9B, 9C, 9D and 9E are performed, a seed layer 726 is formed in the at least one through hole 102T. In some embodiments, the seed layer 726 is conformal with the exposed surfaces of the insulation layer 112 and the conductive pad 108 of the semiconductor chip 106. In some embodiments, the seed layer 726 directly contacts the insulation layer 112 and the conductive pad 108 of the semiconductor chip 106.

Operations similar to those illustrated in FIG. 9F are then performed to form a conductive interconnect 104 on the seed layer 226. Next, operations similar to those illustrated in FIG. 9G are performed to form a dielectric layer 116 on the conductive interconnect 104 and a surface 112*b* (also referred to as "a bottom surface") of the insulation layer 112 exposed from the conductive interconnect 104. Operations similar to those illustrated in FIG. 9G are then performed to form a metal finish layer 114 on the conductive interconnect 104 and adjacent to the dielectric layer 116. Accordingly, a semiconductor package having a structure similar to that of the semiconductor package 200A in FIG. 5 except for further including the encapsulation layer 120 is formed.

FIG. 11A, FIG. 11B, FIG. 11C, FIG. 11D, FIG. 11E and FIG. 11F illustrate a method of manufacturing a semiconductor package in accordance with some embodiments of the present disclosure. Various figures have been simplified for better understanding of the aspects of the present disclosure.

Figure 11A:
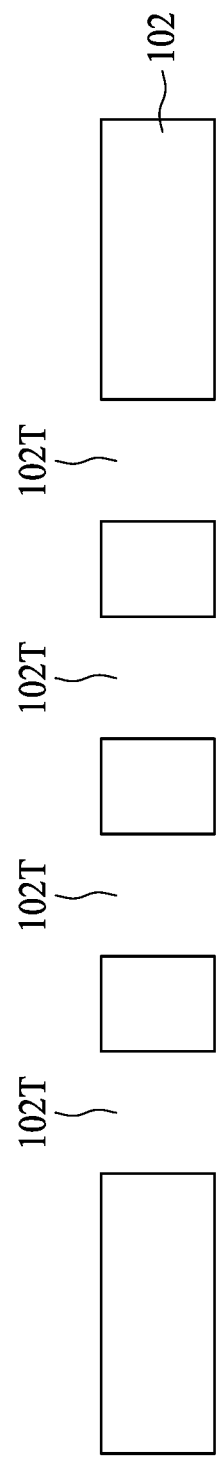
FIG. 11A, FIG. 11B, FIG. 11C, FIG. 11D, FIG. 11E and FIG. 11F illustrate a method of manufacturing a semiconductor package in accordance with some embodiments of the present disclosure.

Referring to FIG. 11A, operations similar to those as illustrated in FIG. 9A are performed to provide a core layer 102 having at least one through hole 102T. In some embodiments, the core layer 102 includes a metal material having a CTE from about $2 \times 10^{-6}$/K to about $10 \times 10^{-6}$/K.

Figure 11B:
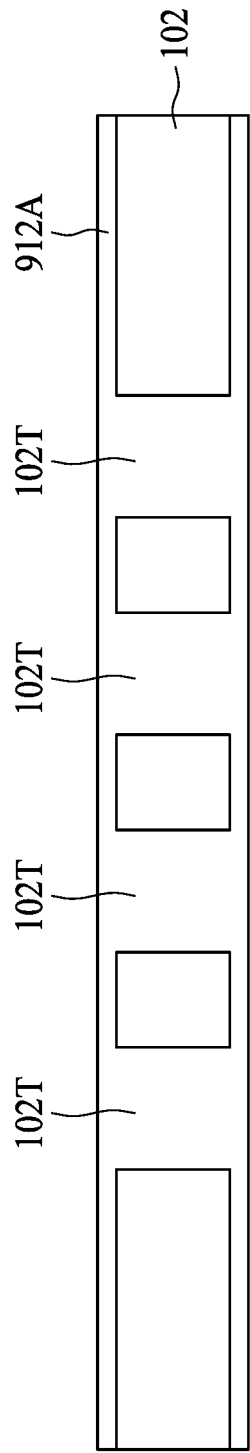

Referring to FIG. 11B, the core layer 102 is covered and the at least one through hole 112T is filled with an insulation material 912A by, for example, a coating process. In some embodiments, the insulation material 912A is formed of or includes polyimide (PI).

Figure 11C:
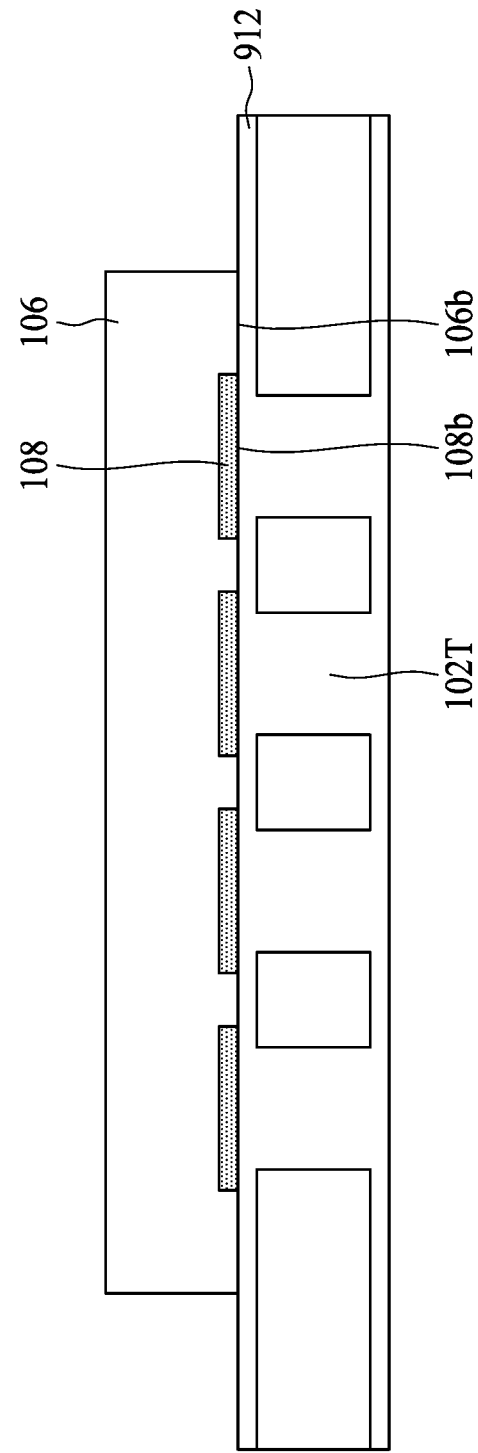

Referring to FIG. 11C, a semiconductor chip 106 including a conductive pad 108 is disposed on the core layer 102. The conductive pad 108 is disposed above and corresponding to the at least one through hole 102T filled with the insulation material 912A. In some embodiments, the semiconductor chip 106 including the conductive pad 108 directly contacts the insulation material 912A. In some embodiments, a surface 106b of the semiconductor chip 106 and a surface 108b of the conductive pad 108 directly contact the insulation material 912A. Still referring to FIG. 11C, after the semiconductor chip 106 including the conductive pad 108 is disposed directly on the insulation material 912A, the insulation material 912A is cured to form the insulation material layer 912.

Figure 11D:
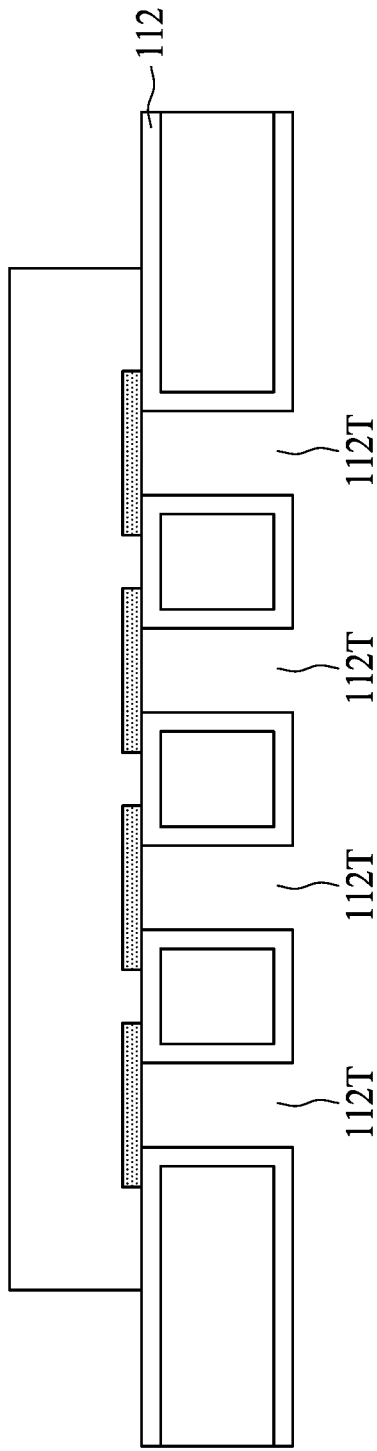

Referring to FIG. 11D, the insulation material layer 912 is then partially removed to form at least one opening 112T within the at least one through hole 102T. The conductive pad 108 is exposed from the at least one opening 112T. In some embodiments, the as-formed insulation layer 112 covers the core layer 102.

Figure 11E:
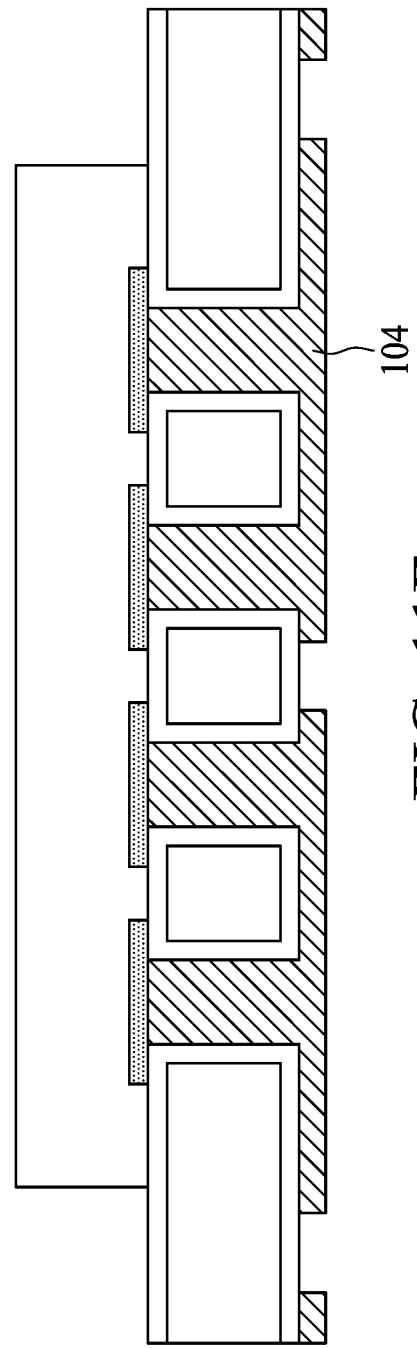
Figure 11F:
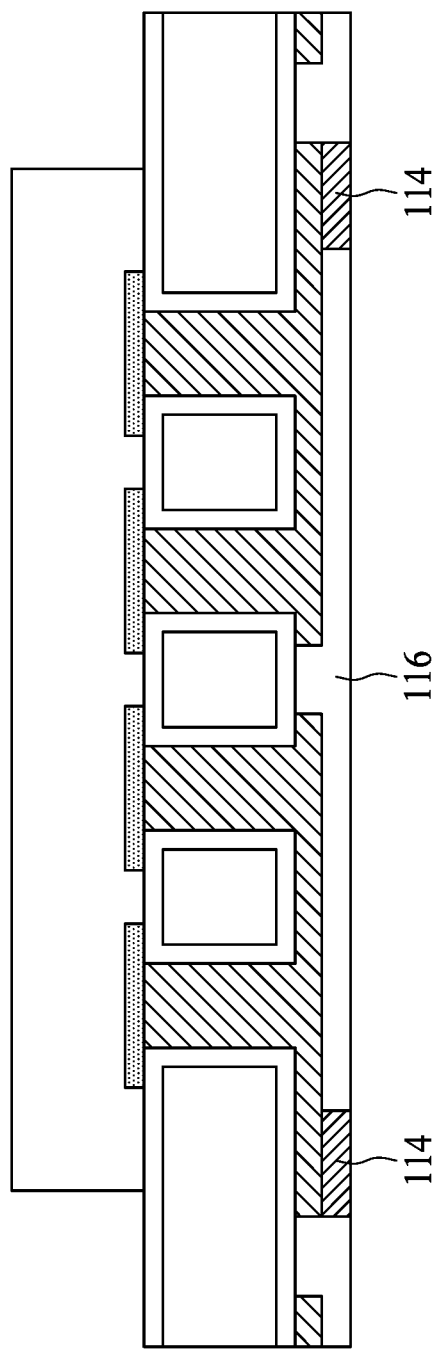

Referring to FIGS. 11E and 11F, operations similar to those illustrated in FIGS. 9F and 9G are then performed to form the semiconductor package 200 as shown in FIG. 4.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package, comprising:
    a core layer having a top surface and a bottom surface opposite to the top surface, wherein the core layer comprises a metal material;
    a conductive interconnect penetrating through the core layer, the conductive interconnect having a top surface and a bottom surface respectively exposed from the top surface and the bottom surface of the core layer;
    a semiconductor chip disposed on the top surface of the core layer, wherein the semiconductor chip comprises a conductive pad, and the top surface of the conductive interconnect directly contacts the conductive pad; and
    an insulation layer between the core layer and the conductive interconnect.

2. The semiconductor package as claimed in claim 1, wherein the core layer has a coefficient of thermal expansion (CTE) equal to or smaller than $10 \times 10^{-6}$/K.

3. The semiconductor package as claimed in claim 2, wherein the core layer has a CTE from $2 \times 10^{-6}$/K to $10 \times 10^{-6}$/K.

4. The semiconductor package as claimed in claim 1, wherein the conductive interconnect comprises a vertical portion penetrating through the core layer and a horizontal portion extending in at least a portion of the bottom surface of the core layer.

5. The semiconductor package as claimed in claim 1, wherein the insulation layer is disposed between and directly contacting the top surface of the core layer and a bottom surface of the semiconductor chip.

6. The semiconductor package as claimed in claim 5, wherein the conductive interconnect directly contacts a bottom surface of the conductive pad, and at least a portion of the insulation layer directly contacts the top surface of the core layer, the bottom surface of the conductive pad, and the conductive interconnect.

7. The semiconductor package as claimed in claim 1, further comprising:
a metal finish layer disposed on the bottom surface of the conductive interconnect, wherein a material of the metal finish layer is different from a material of the conductive interconnect.

8. The semiconductor package as claimed in claim 7, further comprising:
a dielectric layer disposed on the bottom surface of the core layer and the bottom surface of the conductive interconnect, the dielectric layer being adjacent to the metal finish layer.

9. The semiconductor package as claimed in claim 1, wherein the conductive interconnect comprises:
a conductive layer penetrating through the core layer; and
a seed layer disposed between and directly contacting the conductive layer and the conductive pad, wherein the seed layer (226) is between the insulation layer (112) and the conductive layer (224).

10. A semiconductor package, comprising:
a core layer comprising a metal material;
a semiconductor chip disposed on a top surface of the core layer, the semiconductor chip comprising a conductive pad;
a conductive interconnect penetrating through the core layer to electrically connect to the conductive pad;
an adhesive layer disposed between the core layer and the semiconductor chip, wherein the adhesive layer directly contacts the semiconductor chip; and
an insulation layer between the core layer and the conductive interconnect.

11. The semiconductor package as claimed in claim 10, wherein the core layer has a bottom surface opposite to the top surface, the conductive interconnect comprises a plurality of vertical portions penetrating through the core layer and a horizontal portion extending in at least a portion of the bottom surface of the core layer.

12. The semiconductor package as claimed in claim 11, wherein the plurality of vertical portions are surrounded by the core layer and connected to the horizontal portion, and the horizontal portion directly contacts the bottom surface of the core layer.

13. The semiconductor package as claimed in claim 11, wherein a height of each of the vertical portions of the conductive interconnect is greater than a thickness of the core layer.

14. The semiconductor package as claimed in claim 10, wherein the core layer has a coefficient of thermal expansion (CTE) equal to or smaller than $10 \times 10^{-6}$/K.

15. A method for manufacturing a semiconductor package, comprising:
providing a core layer having at least one through hole;
disposing a semiconductor chip on the core layer, wherein the semiconductor chip comprises a conductive pad disposed above the at least one through hole;
forming a seed layer in the at least one through hole; and
disposing a conductive material layer in the at least one through hole to form a conductive interconnect directly contacting the conductive pad, wherein forming the seed layer in the at least one through hole is before disposing the conductive material layer in the at least one through hole, and the conductive material layer is formed on the seed layer.

16. The method as claimed in claim 15, further comprising:
forming an adhesive layer on a top surface of the core layer, wherein the semiconductor chip is disposed on the adhesive layer to be attached to the core layer.

17. The method as claimed in claim 16, wherein forming the adhesive layer comprises:
coating an adhesive material layer on the top surface of the core layer; and
curing the adhesive material layer at a temperature of equal to or lower than 150° C. after disposing the semiconductor chip.

18. The method as claimed in claim 15, wherein the core layer comprises a metal material having a CTE from $2 \times 10^{-6}$/K to $10 \times 10^{-6}$/K, and the method further comprises:
forming an insulation layer covering the core layer.

19. The method as claimed in claim 18, wherein forming the insulation layer comprises:
covering the core layer and filling the at least one through hole with an insulation material layer before disposing the semiconductor chip on the core layer; and
partially removing the insulation material layer to form at least one opening within the at least one through hole, wherein the conductive material layer is disposed in the at least one opening within the at least one through hole.

20. The semiconductor package as claimed in claim 1, wherein the core layer further has an inner lateral surface extending between the top surface and the bottom surface, and the insulation layer covers the top surface, the bottom surface, and the inner lateral surface of the core layer.

21. The semiconductor package as claimed in claim 10, wherein the conductive interconnect comprises:
a conductive layer penetrating through the core layer; and
a seed layer between the insulation layer and the conductive layer.

22. The semiconductor package as claimed in claim 10, wherein the core layer further has a bottom surface opposite to the top surface and an inner lateral surface extending between the top surface and the bottom surface, and the insulation layer covers the top surface, the bottom surface, and the inner lateral surface of the core layer.

23. The semiconductor package as claimed in claim 10, wherein the adhesive layer contacts a top surface of the insulation layer.

* * * * *